United States Patent [19]

Beegan

[11] Patent Number: 4,806,957
[45] Date of Patent: Feb. 21, 1989

[54] ELECTROSTATIC PRINTHEAD AND METHOD OF MANUFACTURE

[75] Inventor: David T. Beegan, Newport Beach, Calif.

[73] Assignee: Calcomp Inc., Anaheim, Calif.

[21] Appl. No.: 170,439

[22] Filed: Mar. 21, 1988

[51] Int. Cl.$^4$ .......................................... G01D 15/06
[52] U.S. Cl. ........................................ 346/155; 29/854
[58] Field of Search .............. 346/155, 139 R, 139 C; 29/592 R, 854, 876, 877, 884, 729, 739; 400/119

[56] References Cited

U.S. PATENT DOCUMENTS 3,903,594  5/1974  Koneval ............................. 346/155

FOREIGN PATENT DOCUMENTS 0047652  4/1979  Japan ................................. 346/155

Primary Examiner—Arthur G. Evans
Attorney, Agent, or Firm—Donald A. Streck; Wm. F. Porter, Jr.

[57] ABSTRACT

A new design for electrostatic printheads, and the like, which can be formed quickly, easily, inexpensively, and reliably employing wire bonding techniques. The preferred method disclosed is a method for simultaneously making two electrostatic printhead portions each having a row of dot-producing conducting printwire ends at a planar print face. A pair of printed circuit boards containing a plurality of parallel, spaced, flat, conductor strip ends along edges thereof are disposed in a common plane with the conductor strip ends positioned opposite one another in pairs. Connecting wires are then wire bonded between the pairs of strip ends. The connecting wires are then embedded in an insulating material which will adhesively bond to the printed circuit boards along the edges thereof and cure into a hard material forming the body of the resultant printhead elements. Finally, the cured insulating material is cut between the edges of the printed circuit boards to form a pair of planar print face surfaces with the ends of the connecting wires exposed, thus producing two printhead portions each attached to a printed circuit board and having a single row of printwires at the print face thereof.

4 Claims, 3 Drawing Sheets

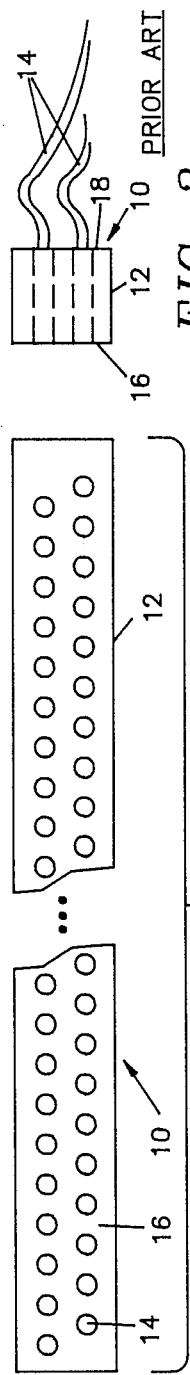
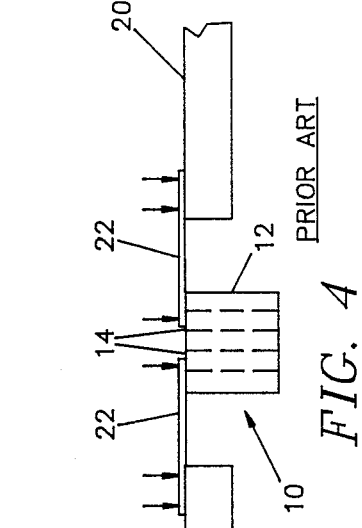
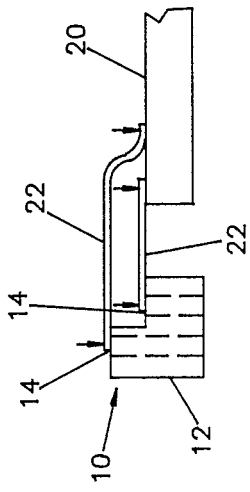
FIG. 1 PRIOR ART
FIG. 2 PRIOR ART
FIG. 3 PRIOR ART
FIG. 4 PRIOR ART
FIG. 5 PRIOR ART
FIG. 6 PRIOR ART

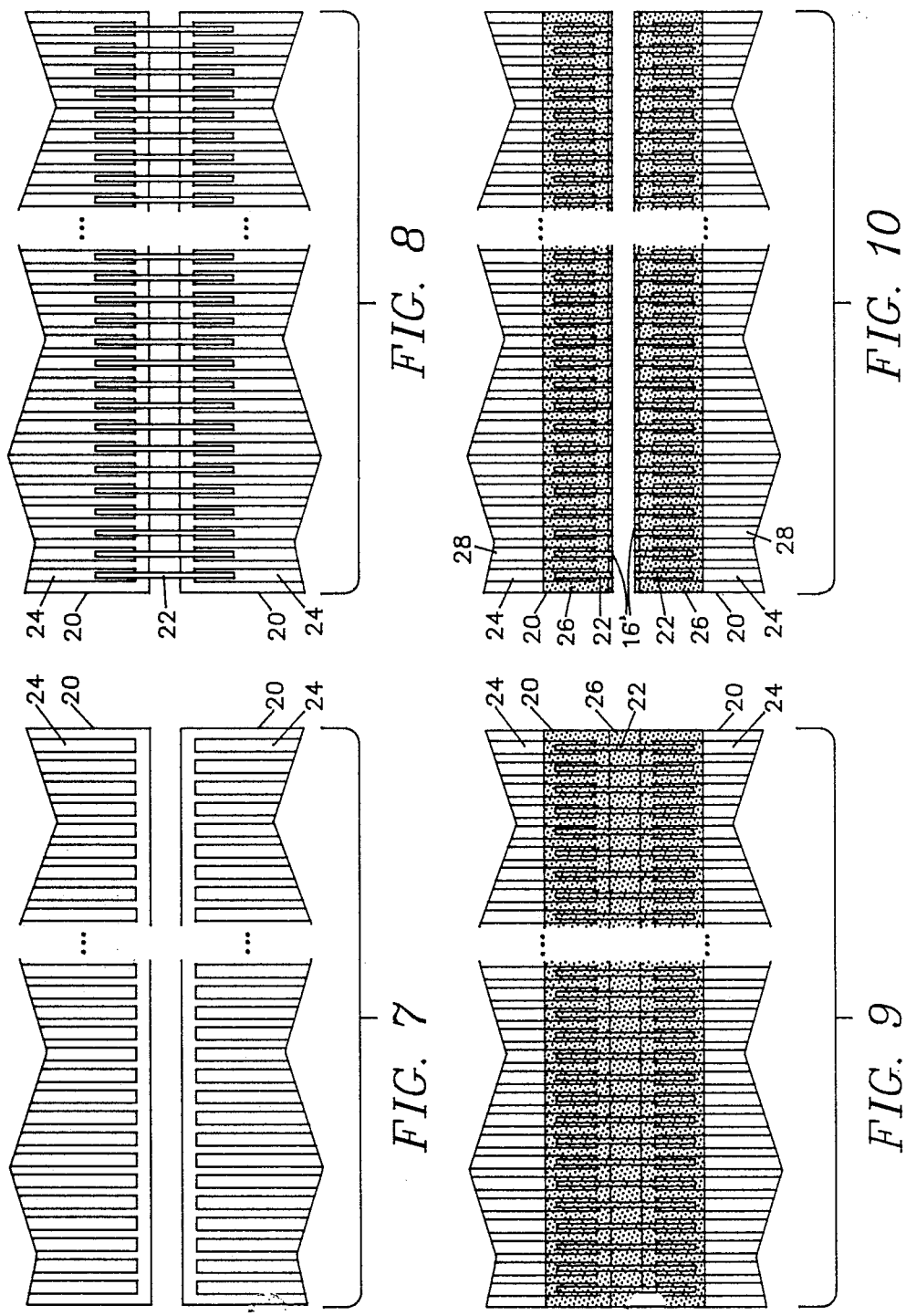

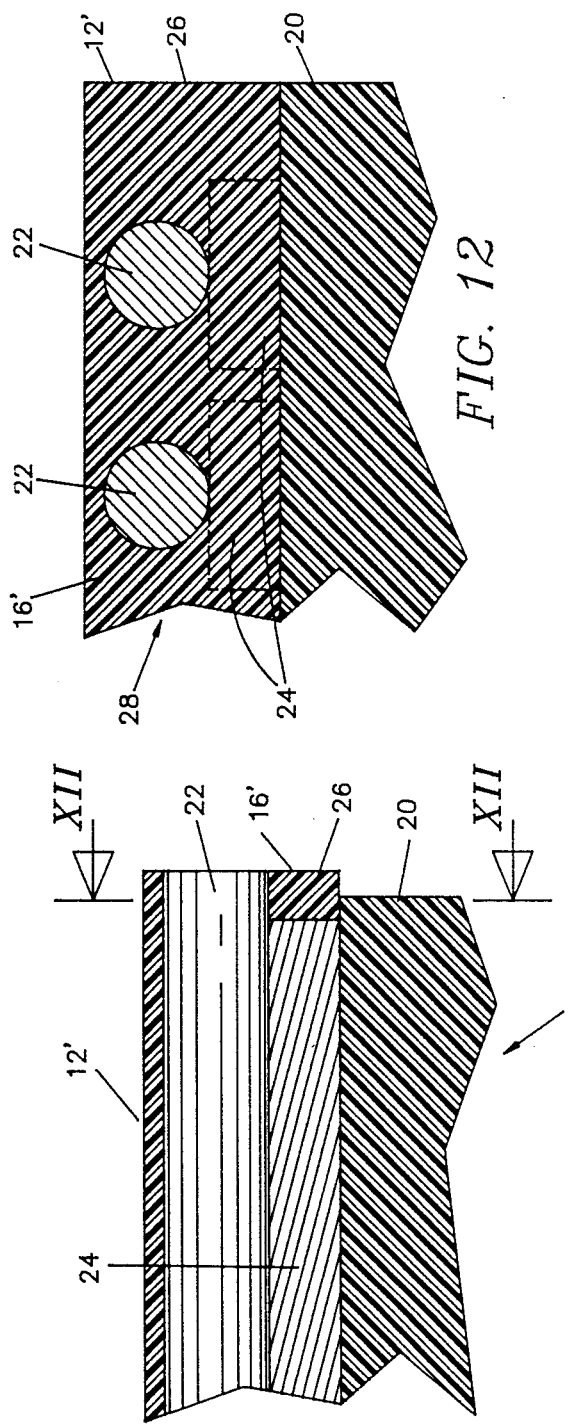
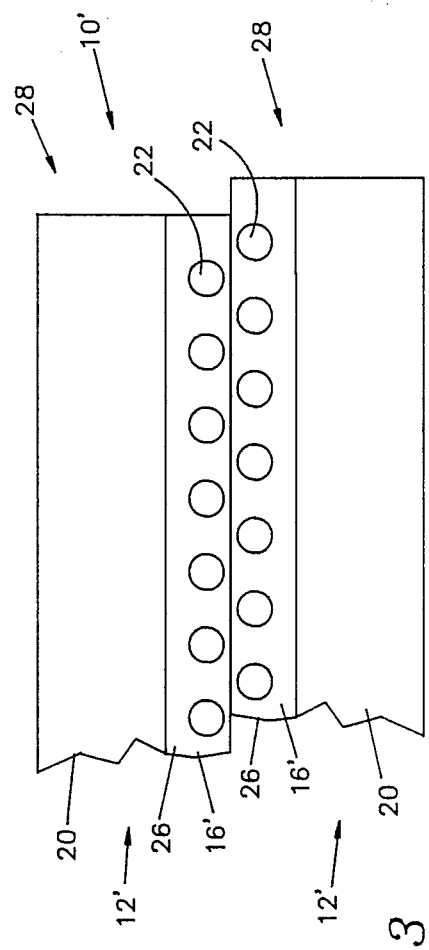

ELECTROSTATIC PRINTHEAD AND METHOD OF MANUFACTURE

BACKGROUND OF THE INVENTION

The present invention relates to electrostatic printheads and, more particularly, to the method of manufacturing electrostatic printhead portions having a row of dot-producing conducting printwire ends at a planar print face comprising, disposing a pair of printed circuit boards containing a plurality of parallel, spaced, flat, conductor strip ends along edges thereof in a common plane with the conductor strip ends disposed opposite one another in pairs; wire bonding connecting wires between the pairs of strip ends; embedding the connecting wires in an insulating material which will adhesively bond to the printed circuit boards along the edges thereof and cure into a hard material forming the body of the resultant printhead elements; and, cutting the cured insulating material between the edges of the printed circuit boards to form a pair of planar print face surfaces with the ends of the connecting wires exposed, thus producing two printhead portions each attached to a printed circuit board and having a single row of printwires at the print face thereof.

In an electrostatic printer, there is a printhead such as that generally indicated as 10 in FIGS. 1 and 2 comprising a body 12 of an insulative material having the exposed ends of a plurality of print wires 14 disposed in rows along the front surface 16 thereof. The other ends of the wires 14 emerge from the rear surface 18 and are used for electrically connecting the wires 14 to the driving circuits of the printer. For high resolution printing, the wires 14 may be 100–500 per inch and a typical printhead 10 in commercial electrostatic printers produced by the assignee of this application contains 14,080 print wires.

As depicted in FIG. 3, the most common technique presently employed in the art for electrically connecting the wires 14 to a printed circuit board 20 containing the connections the driving circuits is to individually hand wire all 14,080 wires to the board 20. As can be appreciated, such hand wiring is very labor intensive and is economically feasible only by having the labor done in countries where lowcost manual labor is available. On the positive side, the hand wiring technique typically produces printheads with virtually no rejections; that is, if one of the wires 14 is not electrically connected as a result of a poor solder joint, or the like, the printhead is useless for commercial use unless and until the defect is found and corrected. Hand wiring generally avoids this problem since the wires are each given individual attention for soldering purposes and are visually inspected as part of that process.

In a co-pending application entitled ELECTROSTATIC PRINTHEAD AND APPARATUS by the applicant herein, and others, Ser. No. 086,919, filed Aug. 19, 1987, which is also assigned to the common assignee of this application, a novel method and apparatus for connecting the wires 14 to a printed circuit board(s) employing wire bonding techniques, in lieu of hand soldering, is described in detail. In one version as depicted in FIGS. 4 and 5, the wires 14 are cut off flush with the rear surface 16 and the connections between the wires 14 and a pair of printed circuit boards 20 (one for each of the two parallel rows of wires as shown in FIG. 1) are accomplished with wire bonding techniques which are well known in the art wherein fine gold or aluminum connecting wires 22 are bonded to the ends of the wires 14 and to the connectors (not shown) on the printed circuit boards 20 by electron beam welding, or the like, as symbolized by the arrows in FIG. 4. The two printed circuit boards 20 are then folded together by bending the connecting wires 22 as shown in FIG. 5. In an alternate version as depicted in FIG. 6, the rear surface 18 is cut into two levels and the connections between the wires 14 and a single printed circuit board 20 are again accomplished with wire bonding techniques wherein the connecting wires 22 are bonded to the ends of the wires 14 on the two levels and to the connectors (not shown) on the printed circuit boards 20 by electron beam welding, or the like, as again symbolized by the arrows in the figure.

While the automated connection methods and the accompanying apparatus taught by the above-referenced, co-pending application are a distinct improvement over the prior art hand-wiring method, the potential for improper or incomplete bonding to the ends of the wires 14 is a consideration of much importance, as can be appreciated from a detailed reading of that application. Since the bonding failure rate must be better than 0.007% (i.e. better than one wire in 14,080) sophisticated self-checking techniques must be incorporated into the wire bonding apparatus to correct any improper bonds at the time that they occur. Such equipment is, of course, complicated and expensive. It would be preferable to come up with a new design for electrostatic printheads, and the like, which could be formed quickly, easily, inexpensively, and reliably employing wire bonding techniques instead of employing wire bonding techniques as a substitute for hand soldering with the prior art approach to electostatic printhead designs.

Wherefore, it is the principle object of the present invention to provide a new design for electrostatic printheads, and the like, which can be formed quickly, easily, inexpensively, and reliably employing wire bonding techniques.

It is another object of the present invention to provide an automated method of connecting the wires of an electrostatic printhead to printed circuit board(s) with minimum potential for failed joints.

It is another object of the present invention to provide an automated method of forming the wires of an electrostatic printhead and connecting them to printed circuit board(s) employing wire bonding techniques.

It is still another object of the present invention to provide an automated method of forming an electrostatic printhead on the edges of printed circuit board(s) and for electrically connecting the printwires thereof employing wire bonding techniques.

Other objects and benefits of the present invention will become apparent from the detailed description which follows hereinafter when taken in conjunction with the drawing figures which accompany it.

SUMMARY

The foregoing objects have been achieved by the printhead of the present invention manufactured according to a method wherein a printed circuit board is provided containing a plurality of parallel, spaced, flat, conductor strip ends along edges thereof; connecting wires are wire bonded to the strip ends and extend outward therefrom in a common plane and parallel to one another; the connecting wires are embedded in an insulating material which will adhesively bond to the printed circuit board along the edge thereof and cure into a hard material forming the body of the resultant printhead; and, the cured insulating material is cut parallel to the edge of the printed circuit board to form a planar print face surface with the ends of the connecting wires exposed.

The preferred method of manufacture is a method of manufacturing electrostatic printhead portions having a row of dot-producing conducting printwire ends at a planar print face comprising, disposing a pair of printed circuit boards containing a plurality of parallel, spaced, flat, conductor strip ends along edges thereof in a common plane with the conductor strip ends disposed opposite one another in pairs; wire bonding connecting wires between the pairs of strip ends; embedding the connecting wires in an insulating material which will adhesively bond to the printed circuit boards along the edges thereof and cure into a hard material forming the body of the resultant printhead elements; and, cutting the cured insulating material between the edges of the printed circuit boards to form a pair of planar print face surfaces with the ends of the connecting wires exposed, thus producing two printhead portions each attached to a printed circuit board and having a single row of printwires at the print face thereof.

DESCRIPTION OF THE DRAWINGS

FIG. 1 is a simplified drawing of the printing face of an electrostatic printhead as wherein the present invention is applicable.

FIG. 2 is a sideview of the printhead of FIG. 1 prior to its electrical connection to a printed circuit board for use in an electostatic printer.

FIG. 3 is a simplified drawing depicting a prior art method of electrically connecting the printhead of FIG. 1 to a printed circuit board.

FIGS. 4 and 5 are simplified drawings depicting another prior art method of electrically connecting the printhead of FIG. 1 to a printed circuit board by wire bonding techniques.

FIG. 6 is a simplified drawing depicting an alternate prior art method of electrically connecting the printhead of FIG. 1 to a printed circuit board by wire bonding techniques.

FIGS. 7-10 are plan views of portions of the edges of printed circuit boards depicting the method of the present invention for forming an electrostatic printhead directly on the edges of the printed circuit boards.

FIG. 11 is an enlarged, partially cutaway, side view showing one printhead wire in an electrostatic printhead formed by the method of the present invention.

FIG. 12 is a cutaway view of FIG. 11 in the plane XII—XII.

FIG. 13 is a partially cutaway end view showing how two printhead rows formed by the method of the present invention can be juxtaposed in an offset manner to create a two-row electrostatic printhead.

DESCRIPTION OF THE PREFERRED EMBODIMENT

Simply stated, the present invention achieves its objectives by completely eliminating the prior art printhead 10 of FIGS. 1-6 and its attendant interconnection problems. Instead, the wire bonding connecting wires are incorporated into printhead elements formed in situ on the edges of the printed circuit boards themselves.

This is particularly beneficial to the performance of the resultant printhead as well. While the wires 14 of the prior art printhead 10 were about 2 mils in diameter and, therefore, made a small target for bonding the approximately 1 mil diameter connecting wires 22 thereto, as those skilled in the art will appreciate, with the connecting wires acting as the printwires themselves, their much smaller diameter provides the potential for much higher resolution printheads. Moreover, since the connecting wires are being bonded to printed circuit board conductors in the usual manner, the resultant connections can be affected simply and reliably employing standard wirebonding apparatus with little or no modification required thereto.

The method of constructing the printhead of the present invention is depicted in FIGS. 7-10 with details thereof provided in FIGS. 11-13. As shown in FIG. 7, a pair of printed circuit boards 20 containing a plurality of parallel, spaced, flat, conductor strip ends 24 along the edges thereof are positioned in a common plane with the conductor strip ends 24 disposed opposite one another in pairs. As then shown in FIG. 8, the opposed pairs flat conductor strip ends 24 are interconnected with connecting wires 22 employing conventional wire bonding apparatus. Since the space is available because of the flat configuration employed, it is preferred that the wires 22 be double bonded on each end to minimize the potential for an improperly bonded joint.

As depicted in FIG. 9, the strip ends 24 and the interconnecting wires 22 are then embedded in an epoxy material 26, or a similar insulating material, which adhesively bonds to the printed circuit boards along the edges thereof and cures into a hard material which will form the body 12' of the resultant printhead. As shown in FIG. 10, the material 26 is then cut away with a laser, or the like, or by grinding to form the front surfaces 16' with the wires 22 exposed, thus forming two printhead portions 28 having a single row of printwires as best understood by reference to the enlarged cutaway drawings of FIGS. 11 and 12. If it is desired to create a printhead 10' of the type shown in FIG. 1 wherein there are multiple adjacent rows of offset exposed printwires to affect closer dot spacing than is physically possible in a single row, two, or more, printhead portions 28 can be bonded together as shown in FIG. 13.

Wherefore, having thus described the present invention, What is claimed is:

1. The method of manufacturing electrostatic printhead portions having a row of dot-producing conducting printwire ends at a planar print face comprising:
   (a) disposing a pair of printed circuit boards containing a plurality of parallel, spaced, flat, conductor strip ends along edges thereof in a common plane with the conductor strip ends disposed opposite one another in pairs;
   (b) wire bonding connecting wires between the pairs of strip ends;
   (c) embedding the connecting wires in an insulating material which will adhesively bond to the printed circuit boards along the edges thereof and cure into a hard material forming the body of the resultant printhead elements; and,
   (d) cutting the cured insulating material between the edges of the printed circuit boards to form a pair of planar print face surfaces with the ends of the connecting wires exposed, thus producing two printhead portions each attached to a printed circuit board and having a single row of printwires at the print face thereof.

2. The method of claim 1 wherein:

said step of embedding the connecting wires in an insulating material comprises embedding the connecting wires in an epoxy material.

3. The method of manufacturing an electrostatic printhead having a row of dot-producing conducting printwire ends at a planar print face comprising:

(a) providing a printed circuit board containing a plurality of parallel, spaced, flat, conductor strip ends along edges thereof;

(b) wire bonding connecting wire to the strip ends and extending outward therefrom in a common plane and parallel to one another;

(c) embedding the connecting wires in an insulating material which will adhesively bond to the printed circuit board along the edge thereof and cure into a hard material forming the body of the resultant printhead; and, (d) cutting the cured insulating material parallel to the edge of the printed circuit board to form a planar print face surface with one ends of the connecting wires exposed.

4. The method of claim 3 wherein:

said step of embedding the connecting wires in an insulating material comprises embedding the connecting wires in an epoxy material.

* * * * *